United States Patent
Tochishita et al.

(10) Patent No.: US 6,821,560 B2
(45) Date of Patent: Nov. 23, 2004

(54) SURFACE-TREATING SUPPORT MEMBER AND METHOD USING THE SAME

(75) Inventors: Yoshimi Tochishita, Hyogo (JP); Yoshio Fujiwara, Hyogo (JP); Yoshihiro Asagai, Hyogo (JP); Ken Ohtagaki, Hyogo (JP)

(73) Assignee: Neomax Co. Ltd., Osaka (JP)

( * ) Notice: Subject to any disclaimer, the term of this patent is extended or adjusted under 35 U.S.C. 154(b) by 44 days.

(21) Appl. No.: 09/883,334

(22) Filed: Jun. 19, 2001

(65) Prior Publication Data

US 2001/0033896 A1 Oct. 25, 2001

Related U.S. Application Data

(62) Division of application No. 09/407,304, filed on Sep. 29, 1999, now Pat. No. 6,280,792.

(30) Foreign Application Priority Data

Oct. 2, 1998 (JP) ............................................ 10-294685

(51) Int. Cl.[7] .............................................. C23C 14/50
(52) U.S. Cl. .................. 427/248.1; 427/251; 427/255.5
(58) Field of Search ............................. 427/248.1, 251, 427/255.5; 118/729, 730, 732; 269/16, 47, 50, 52, 57, 287

(56) References Cited

U.S. PATENT DOCUMENTS

| | | |
|---|---|---|
| 2,524,293 A | 10/1950 | Lindstrom |
| 3,562,140 A | 2/1971 | Skinner et al. |
| 3,582,059 A | 6/1971 | Van Ooy |
| 4,158,681 A | 6/1979 | Funke ........................ 264/0.5 |
| 4,192,253 A | 3/1980 | Aichert et al. |
| 4,560,462 A | 12/1985 | Radford et al. ........ 204/298.28 |
| 5,180,149 A | 1/1993 | Given et al. |
| 5,576,058 A | 11/1996 | Norrgrann et al. |
| 6,047,717 A | 4/2000 | Bhushan et al. |

FOREIGN PATENT DOCUMENTS

| | | |
|---|---|---|
| DE | 1604558 | 2/1970 |
| DE | 92 07 340 U | 10/1992 |
| DE | 92 07 340 | 10/1992 |
| FR | 2412620 | 7/1979 |
| FR | 2 412 620 A | 7/1979 |
| JP | 52-123362 | 10/1977 |
| JP | 55-145336 | 12/1980 |
| JP | 57-131363 | 8/1982 |
| JP | 04119526 | 4/1992 |
| JP | 04-165073 | 6/1992 |
| JP | 09-157844 | 6/1997 |
| JP | 11-350135 | 12/1999 |

OTHER PUBLICATIONS

S. L. Albright, "Designing Springs", Machine Design, Penton, Inc. Cleveland, US vol. 25, No. 9, pp. 134–137, Sep. 1, 1953.

*Primary Examiner*—Timothy Meeks

(57) ABSTRACT

A surface-treating support member for supporting a plurality of works, including an upper cage and a lower cage including a plurality of compartments, so that the cages are openable and closeable in a lengthwise direction. A process for surface-treating a plurality of works rotates the works about their axes using the support member.

6 Claims, 8 Drawing Sheets

PRIOR ART

SURFACE-TREATING SUPPORT MEMBER AND METHOD USING THE SAME

This application is a divisional of 09/407,304 filed on Sep. 29, 1999, now U.S. Pat. No. 6,280,792.

BACKGROUND OF THE INVENTION

1. Field of the Invention

The present invention relates to a surface treating process, and in particular, a surface treating process for forming a deposited film of a metal such as aluminum, zinc and tin, or a metal nitride such as titanium nitride on the surface of a sintered product such as, for example, a rare earth metal-based magnet liable to be oxidized, and the like, thereby ensuring that the sintered product such as the rare earth metal-based magnet has an oxidation resistance.

In more particular, the present invention relates to a surface treating process capable of surface-treating a large number of works collectively and uniformly such as a sintered product, e.g., a rare earth metal-based magnet having a shape having an inside diameter portion such as a ring-like shape and the like, and to a surface-treating support member, a surface treating holder and a surface treating apparatus which are suitable for use in such process.

2. Description of the Related Art

For example, in a conventional surface treating process for a rare earth metal-based magnet, a vacuum vapor-deposition apparatus 120 as shown in FIG. 11 was used to carry out a vapor deposition of aluminum. In FIG. 11, reference character 121 designates a vacuum treating chamber which can be maintained at a predetermined degree of vacuum through a vacuum pump 122. In the vacuum treating chamber 121, aluminum 123, which is an evaporation source, is heated within an evaporation source holder 124 by a heater 125. A rare earth metal-based magnet article 130 as a work is accommodated in a cage-like container 126, and the vapor deposition of aluminum is carried out, while rotating the container 126, thereby uniformly depositing aluminum on the rare earth metal-based magnet article 130 as the work.

In the above conventional surface treating process, however, the substantially uniform vapor-deposition can be performed certainly. However, because the works are piled one on another within the cage-like container, it cannot be avoided that some deposition nonuniformity is produced. Therefore, it has been desired to propose a surface treating process by which a further uniform surface treatment can be performed. Many of rare earth metal-based magnet articles such as Nd—Fe—B based magnet articles, for example, resulting from the processing treatment, are rectangular parallelepiped, hard and moreover, have sharp corners. For this reason, the following problem is arisen: The corners collide with one another during the vapor deposition treatment, whereby the deposited film on the surface is peeled off and in a severe case, the corners of a product are chipped, resulting in a poor yield. Particularly, in a case of a large-sized article, there is a problem that the weight is large, and the collision energy is large, resulting in an extremely reduced yield. In a case of a work having an inside diameter portion and having a shape such as a ring-like shape and the like, there is a disadvantage that the inside diameter side of the work is occluded by the other work and for this reason, the uniform surface treatment of the inside diameter side cannot be achieved successfully.

SUMMARY OF THE INVENTION

Accordingly, it is an object of the present invention to provide a surface treating process, wherein the problems and disadvantages associated with the conventional process can be overcome, and even a plurality of works each having an inside diameter portion and having a shape such as a ring-like shape and the like can be uniformly surface-treated collectively.

As a result of zealous reviews, the present inventors have found that the surface treatment of works such as a vapor deposition meeting the above requirement can be carried out in a state in which the works has been spaced apart from one another, while rotating the works about their axes, or rotating the works about a rotational axis, or rotating the works about the rotational axis and about their axes.

To achieve the above object, according to a first aspect and feature of the present invention, there is provided a surface-treating support member for supporting a plurality of works, comprising an upper cage and a lower cage including a large number of compartments, so that the cages are openable and closable in a lengthwise direction.

With the above feature, the surface-treating support member is comprised of the upper and lower cages including the large number of compartments, so that the cages are openable and closable in the lengthwise direction. Therefore, the works can be accommodated into the cage-like compartments at distances and removed from the cage-like compartments by opening and closing the upper and lower cages.

The shape, mesh size and the like of each cage may be selected properly, so that clearances can be formed at a size enough to ensure that a surface-treating material can reach works sufficiently and uniformly in correspondence to the size and shape of the work.

According to a second aspect and feature of the present invention, there is provided a surface-treating support member for supporting a plurality of works each having an inside diameter portion, comprising plate-like elements openably and closably foldable in a lengthwise direction, the plate-like elements being capable of defining a plurality of narrow sections each having a length corresponding to the inside diameter of the work in opened states.

According to a third aspect and feature of the present invention, in addition to the second feature, the plate-like elements are openably and closably foldable by a hinge.

With the above features, the surface-treating support member is comprised of plate-like elements openably and closably foldable in a lengthwise direction, so that the plurality of narrow sections each having a length corresponding to the inside diameter of the work can be defined in the opened state. Therefore, works can be set respectively in the narrow sections in the folded states of the plate-like elements, and then supported in spaced-apart states in the narrow sections by folding up the plate-like elements. After the surface treatment, the works can be easily removed from the support member by folding the plate-like elements again.

Particularly, by ensuring that the plate-like elements can be openably and closably folded by the hinge, it is easy to mount and remove the works to and from the support member.

The shape, size and the like of each of the narrow sections may be selected, so that the works can be maintained in the spaced-apart states in correspondence to the size and shape of the work.

According to a fourth aspect and feature of the present invention, there is provided a surface treating holder comprising a wire which is coiled at distances in such a manner that it is formed as a spring-like tubular structure having spiral-line faces at opposite ends thereof, so that works can be accommodated in the tubular structure.

According to a fifth aspect and feature of the present invention, in addition to the fourth feature, the tubular structure is a cylindrical structure.

According to a sixth aspect and feature of the present invention, in addition to the fourth feature, an entanglement preventing spring is wound around that portion of the wire which forms the side face of the tubular structure.

According to a seventh aspect and feature of the present invention, in addition to the fourth feature, the wire is closely wound in the vicinity of opposite ends of a side face of the tubular structure.

According to an eight aspect and feature of the present invention, in addition to the fourth feature, the central portion of the wire is closely wound at locations corresponding to the spiral-line faces of the tubular structure.

According to a ninth aspect and feature of the present invention, in addition to the fourth feature, the wire is formed of a stainless steel.

In the surface-treating holder, the wire is coiled at distances in such a manner that it is formed as the spring-like tubular structure having spiral-line faces at opposite ends thereof, so that the works can be accommodated in the tubular structure. Therefore, the uniform surface treatment such as vapor deposition of aluminum can be carried out from the clearances defined by the wire. In addition, even when the holders collide with one another, the works within the holders cannot collide with one another. Moreover, no large shock cannot be applied to the work within the holder by the aid of a spring property possessed by the holder and hence, the peeling-off of a treated surface, the chipping of a product and the like cannot be produced. The work can be placed into and removed from the holder through the clearances defined by the wire by utilizing the spring property and thus, special inlet and outlet are not required.

The diameter, number of turns and pitch of turns of the wire may be selected properly, taking account of the formation of the clearance having a size enough to enable the appropriate spring property and the fact that the surface treating material can reach the work sufficiently and uniformly.

If the holder is tubular, the shape of the holder is particularly not limited, and the holder may be elliptical. However, if it is taken into consideration that the holder can be easily rotated, and that the material is deposited uniformly, it is preferable that the holder is cylindrical.

In addition, by winding the entanglement preventing spring around that portion of the wire which forms the side face of the tubular structure, the wires forming the holders can be prevented from entering a clearance defined between both of the wires, whereby the entanglement of the wires forming the holders with one another is prevented.

The entering of the wires forming the holder into the clearance defined between both of the wires can be inhibited likewise even by closely coiling the wire in the vicinity of the opposite ends of the side face of the tubular structure, or by closely coiling the central portion of the wire at the opposite spiral-line faces of the tube, whereby the entanglement of the wires forming the holders with one another is prevented. This ensures that the uniform surface treatment such as vapor deposition of aluminum is feasible.

By forming the wire from a stainless steel, for example, aluminum or the like deposited on the wire can be washed off by an acid. In addition, the spring property is not damaged even by the vapor deposition carried out at a high temperature, unlike iron.

In this way, if the surface treatment such as vapor deposition of aluminum is carried out in a state in which a work comprising a rare earth metal-based magnet has been accommodated in the surface treating holder having the above-described arrangement, the uniform surface treatment as ever can be achieved through the clearances defined by the wire, and moreover, the peeling-off of the treated surface, the chipping of a product and the like cannot be produced, leading to an excellent yield.

According to a tenth aspect and feature of the present invention, there is provided a process for surface-treating a plurality of works, comprising the step of surface-treating the works in a treating chamber, while rotating the works about their axes in spaced-apart states.

According to an eleventh aspect and feature of the present invention, in addition to the tenth feature, the surface treatment is a vapor deposition on a sintered article.

According to a twelfth aspect and feature of the present invention, in addition to the tenth feature, the rotation of the works about their axes is conducted with the works supported by a support member rotated about its axes.

According to a thirteenth aspect and feature of the present invention, in addition to the twelfth feature, the surface treatment is a vapor deposition on a sintered article.

According to a fourteenth aspect and feature of the present invention, in addition to the twelfth feature, a support member according to the first feature is used.

According to a fifteenth aspect and feature of the present invention, in addition to the fourteenth feature, the surface treatment is a vapor deposition on a sintered article.

According to a sixteenth aspect and feature of the present invention, in addition to the twelfth feature, a support member according to the second feature is used.

According to a seventeenth aspect and feature of the present invention, in addition to the sixteenth feature, the surface treatment is a vapor deposition on a sintered article.

According to an eighteenth aspect and feature of the present invention, in addition to the tenth feature, each of the works is accommodated in corresponding one of holders according to the fourth feature, and the holders are rotated about their axes within a porous cage-like rotatable member.

According to a nineteenth aspect and feature of the present invention, in addition to the eighteenth feature, the surface treatment is a vapor deposition on a sintered article.

According to a twentieth aspect and feature of the present invention, there is provided a process for surface-treating a plurality of works, comprising the step of surface-treating the works, while rotating them about a rotational axis in spaced-apart states.

According to a twenty first aspect and feature of the present invention, in addition to the twentieth feature, the surface treatment is a vapor deposition on a sintered article.

According to a twenty second aspect and feature of the present invention, in addition to the twentieth feature, the rotation of the works about their axes is carried out with the works supported by a support member rotated about a rotational axis.

According to a twenty third aspect and feature of the present invention, in addition to the twenty second feature, the surface treatment is a vapor deposition on a sintered article.

According to a twenty fourth aspect and feature of the present invention, in addition to the twenty second feature, a support member according to the first feature is used.

According to a twenty fifth aspect and feature of the present invention, in addition to the twenty fourth feature, the surface treatment is a vapor deposition on a sintered article.

According to a twenty sixth aspect and feature of the present invention, in addition to the twenty second feature, a support member according to the second feature is used.

According to a twenty seventh aspect and feature of the present invention, in addition to the twenty sixth feature, the surface treatment is a vapor deposition on a sintered article.

According to a twenty eighth aspect and feature of the present invention, there is provided a process for surface-treating a plurality of works, comprising the step of surface-treating the works, while rotating them about their axes and about a rotational axis in spaced-apart states.

According to a twenty ninth aspect and feature of the present invention, in addition to the twenty eighth feature, the surface treatment is a vapor deposition on a sintered article.

According to a thirtieth aspect and feature of the present invention, in addition to the twenty eighth feature, the rotation of the works about the rotational axis conducted while being rotated about their axes is carried out with the works supported by a support member rotated about a rotational axis and about its axis.

According to a thirty first aspect and feature of the present invention, in addition to the thirtieth feature, the surface treatment is a vapor deposition on a sintered article.

According to a thirty second aspect and feature of the present invention, in addition to the thirtieth feature, a support member according to the first feature is used.

According to a thirty third aspect and feature of the present invention, in addition to the thirty second feature, the surface treatment is a vapor deposition on a sintered article.

According to a thirty fourth aspect and feature of the present invention, in addition to the thirtieth feature, a support member according to the second feature is used.

According to a thirty fifth aspect and feature of the present invention, in addition to the thirty fourth feature, the surface treatment is a vapor deposition on a sintered article.

In the above process for surface-treating the plurality of works, the surface treatment of the works is carried out in the treating chamber in spaced-apart states, while rotating the works about their axes, or rotating the works about the rotational axis, or rotating the works about their axes and about the rotational axis. Therefore, the entire surfaces of the works can be treated uniformly and simultaneously.

Thus, by such uniform surface treatment of the works in the spaced-apart states, a film of a soft metal such as aluminum, tin and zinc or a hard metal nitride such as titanium nitride can be deposited uniformly even on a hard and brittle sintered article.

The rotation of the works about their axes, or about the rotational axis, or about their axes and about the rotational axis can be reliably achieved by supporting the works by the support member rotated about its axis, or about the rotational axis, or about its axis and about the rotational axis.

In this case, the works can be rotated about their axes, or about the rotational axis, or about their axes and about the rotational axis in the spaced-apart states by use of the surface-treating support member according to the above-described feature of the present invention. When the surface-treating support member is used which is comprised of the upper and lower cages including the cage-like compartments, so that the cages are openable and closable in the lengthwise direction, the works can be treated, irrespective of the shape of the works and particularly, even if they are large-sized.

In addition, by using the surface-treating support member which is comprised of the plate-like support elements openably and closably foldable in the lengthwise direction, so that the plurality of narrow sections each having a length corresponding to an inside diameter of a work having an inner diameter portion are defined in the opened states of the plate-like elements, the works having the inside diameter portion and having a disk-like shape or the like can be rotated about their axes, or about the rotational axis, or about their axes and about the rotational axis, while being reliably maintained in the spaced-apart states. Particularly, when the works are supported at the inside diameter in the above manner, the works can be orientated vertically in the lengthwise direction with respect to the treating material source such as a vapor deposition source. Moreover, the reaching of the treating material to the surfaces of the works cannot be blocked, except for the inside diameter-supported points of the works, whereby a very efficient surface treatment can be achieved. Therefore, a vacuum deposition in a short time is feasible, and the surface treatment can be finished before rising of the temperature. The surface treatment of, for example, an Nd—Fe—B rare earth metal-based sintered magnet article can be achieved in one run with a very good efficiency at a temperature of 400° C. or less at which the magnetic property is not degraded. The inside diameter-supporting is by point contact, and the point contact sites are moved properly, whereby the entire inside diameter is surface-treated.

Moreover, in this case, if the vapor deposition is carried out in a state in which the negative pole has been connected to the support member; the works have been placed in their insulated states, and the vapor deposition source has been connected to a positive pole, the uniform surface treatment can be performed for the inside diameter side. It is convenient that the negative pole is connectable to the works through the means for rotating the works about their axes, because the negative pole can be connected to the works, when a surface cleaning treatment is to be conducted with argon gas.

The rotation of the works about their axes can be also performed by a method other than use of the support member, for example, by accommodating the works in the surface-treating holders and rotating the holders about their axes within a porous cage-like rotatable member.

The surface treatment is applicable to the formation of a film by a vapor deposition process and is suitable for depositing any of a metal, a non-metal inorganic substance, an organic compound and the like. The surface treatment is applicable to a vacuum deposition process, an ion sputtering process, an ion plating process, a vapor deposition polymerization and the like.

According to a thirty sixth aspect and feature of the present invention, there is provided a surface treating apparatus, comprising a treating material source provided within a treating chamber, so that a treating material released from the treating material source is delivered to reach works for a surface treatment, and a means for rotating a support member supporting the works about its axis.

According to a thirty seventh aspect and feature of the present invention, in addition to the thirty sixth feature, the surface treating apparatus is a vapor deposition apparatus.

According to a thirty eighth aspect and feature of the present invention, there is provided a surface treating apparatus, comprising a treating material source provided within a treating chamber, so that a treating material released from the treating material source is delivered to reach works for a surface treatment, and a means for rotating a support member supporting the works about a rotational axis.

According to a thirty ninth aspect and feature of the present invention, in addition to the thirty eighth feature, the surface treating apparatus is a vapor deposition apparatus.

According to a fortieth aspect and feature of the present invention, there is provided a surface treating apparatus, comprising a treating material source provided with in a treating chamber, so that a treating material released from the treating material source is delivered to reach works for a surface treatment, and a means for rotating a support member supporting the works about its axis and about a rotational axis.

According to a forty first aspect and feature of the present invention, in addition to the fortieth feature, the surface treating apparatus is a vapor deposition apparatus.

According to a forty second aspect and feature of the present invention, in addition to the fortieth feature, the apparatus further includes at least two rotary plates, on which receiving elements for support members for supporting the works are disposed in a circumferential direction, so that the support members can be supported between the at least two rotary plates through the receiving elements, whereby the support members can be rotated about their axes by the rotation of the receiving elements and rotated about the rotational axis by the rotation of the rotary plates.

According to a forty third aspect and feature of the present invention, in addition to the forty second feature, the surface treating apparatus is a vapor deposition apparatus.

According to a forty fourth aspect and feature of the present invention, in addition to the fortieth feature, the apparatus further includes a means for transmitting a driving force provided by a driving shaft for rotating the support member about the rotational axis to the support member, as a driving force for rotating the support member about its axis.

According to a forty fifth aspect and feature of the present invention, in addition to the forty fourth feature, the surface treating apparatus is a vapor deposition apparatus.

The above-described surface treating apparatus includes the means for rotating the support member for supporting the works about its axis, the means for rotating the support member for supporting the works about the rotational axis, or the means rotating the support member for supporting the works about its axis and about the rotational axis. Therefore, by transporting the surface-treating support member into the treating chamber to set it in the treating chamber, the plurality of works can be surface-treated simultaneously and uniformly, while being rotated about their axes, or about the rotational axis, or about their axes and about the rotational axis in spaced-apart states.

In the surface treating apparatus, the support members can be supported through the receiving elements between the at least two rotary plates on which the receiving elements for supporting the works are disposed in the circumferential direction. In addition, in the surface treating apparatus, the support members can be rotated about their axes by the rotation of the receiving elements and rotated about the rotational axis by the rotation of the rotary plates. Therefore, the plurality of works can be surface-treated simply utilizing the conventional vapor deposition apparatus, while being rotated about their axes, or about the rotational axis, or about their axes and about the rotational axis in the spaced-apart states.

The surface treating apparatus is applicable to the formation of a film by a vapor-phase growth process, and more particularly, examples of such apparatus are a vacuum vapor deposition apparatus, an ion sputtering apparatus, an ion plating apparatus, and a vapor deposition polymerizing apparatus.

The above and other objects, features and advantages of the invention will become apparent from the following description of the preferred embodiment taken in conjunction with the accompanying drawings.

DESCRIPTION OF THE PREFERRED EMBODIMENTS

The present invention will now be described by way of embodiments with reference to the accompanying drawings.

Figure 1:
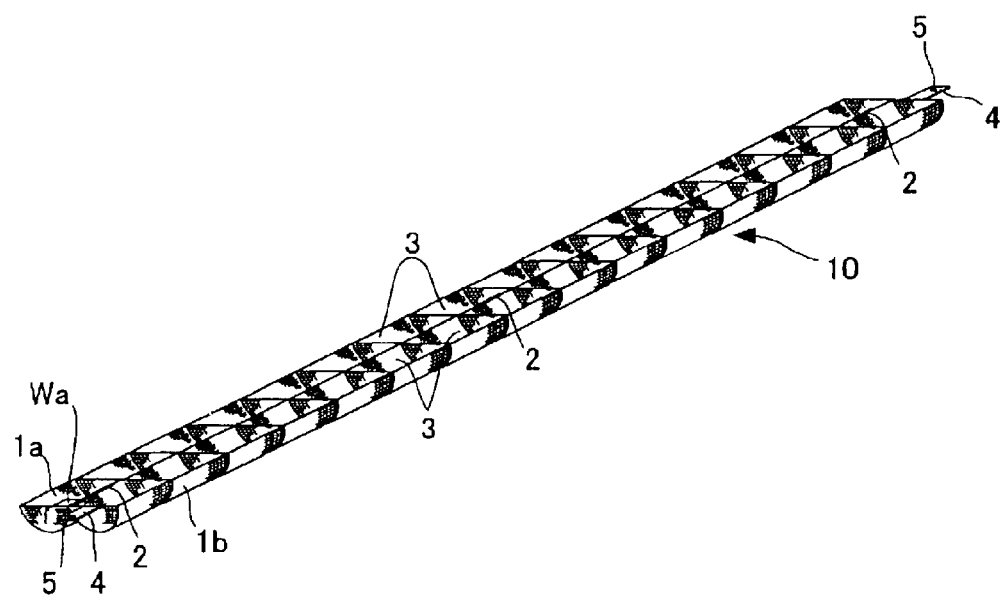
FIG. 1 is a perspective view of an embodiment of a surface-treating support member according to the present invention.

I. Embodiment of Surface-treating Support Member Comprised of Upper and Lower Openable/Closable Cages FIG. 1 shows an embodiment of a surface-treating support member according to the present invention, which is comprised of upper and lower cages each including a large number of cage-like compartments, so that the cages are openable and closable in a lengthwise direction.

The upper and lower cages 1a and 1b constituting the surface-treating support member 10 are formed into symmetrical structures openable and closable through a hinge 2, and each formed of a net made of a stainless steel and having a mesh of 5 mm and a thickness of 1 mm. In the illustrated embodiment, fifteen cage-like compartments 3 are defined in a partitioned manner, so that a work Wa can be accommodated in each of the cage-like compartments 3. In FIG. 1, reference character 4 designates a connecting piece for connecting the surface-treating support member 10 to a receiving element which will be described hereinafter. The connecting piece 4 is capable of being fastened to the receiving element by a screw threadedly inserted into a bore 5. When the surface treatment is conducted, the upper and lower cages 1a and 1b are fastened to each other by a clip or clips (not shown)

II. Embodiment of Surface-treating Support Member Comprised of Openably/Closably Foldable Plate-Like Elements The surface-treating support member of this embodiment is suitable for supporting a plurality of works each having an inside diameter portion.

In FIGS. 2 and 3 showing an embodiment of a surface-treating support member according to the present invention, the support member designated by 20 in FIGS. 2 and 3 is comprised of plate-like elements openably-closably foldable in a lengthwise direction. The plate-like elements are designed, so that a plurality of narrow sections each having a length corresponding to a diameter of a work having an inside diameter portion can be defined in opened states of the plate-like elements.

A surface-treating support member 20 of this embodiment is suitable for supporting a plurality of works each having an inside diameter portion.

Two plate-like elements 6, 6 formed from a plate material made of a stainless steel are formed into openable and closable symmetrical plates and are normally maintained in their folded state under the action of a resilient force of a spring hinge 7.

Grooves 8 are defined at equal distances in each of the plate-like elements 6 along its outer side edge, so that a plurality of narrow sections 9 each having a length corresponding to an inside diameter L of a work Wa having an inside diameter portion are defined by the opposed grooves 8 by opening the plate-like elements 6, 6.

Figure 3A:
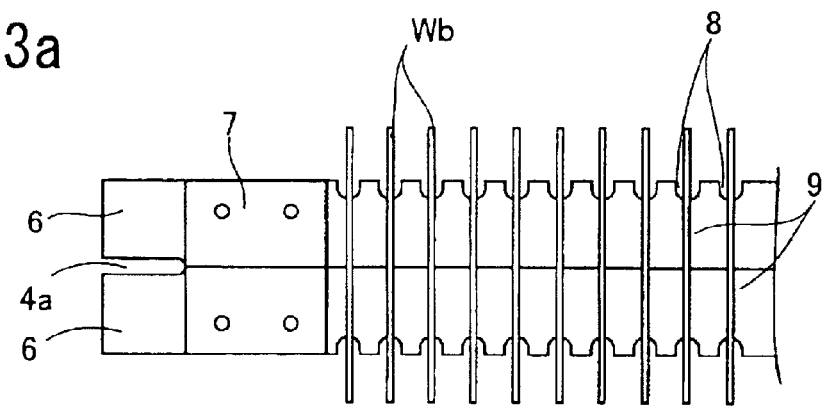
FIGS. 3A and 3B are front and side views of the embodiment of the surface-treating support member according to the present invention during supporting of works.

In FIG. 3A, reference character 4a designates a mounting groove for mounting the support member to the receiving element which will be described hereinafter. Utilizing this groove 4a, the support member can be screwed to the receiving element.

Figure 2A:
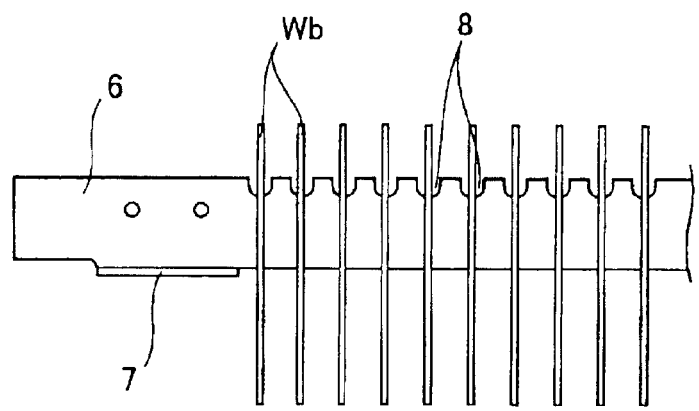
FIGS. 2A and 2B are front and side views of the embodiment of a surface-treating support member according to the present invention during mounting and removal of works.
Figure 2B:
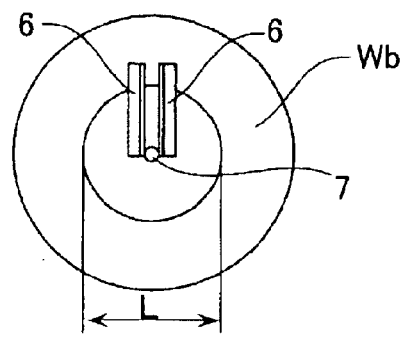
Figure 3B:
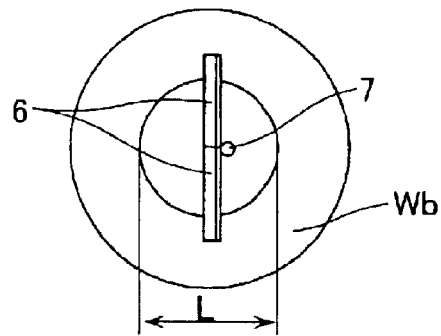

Thus, in a state in which the plate-like elements 6, 6 have been folded up, as shown in FIGS. 2A and 2B, a work Wb having an inside diameter portion can be mounted or removed. In addition, the plate-like elements 6, 6 can be brought into opened states, as shown in FIGS. 3A and 3B, and the work Wb can be supported at its inside diameter portion. It should be noted that the length of the narrow section 9 can be slightly shorter than the inside diameter L, so that the work Wb can be rotated to some extent from the supported state, whereby the supported (contact) position can be changed.

Figure 4:
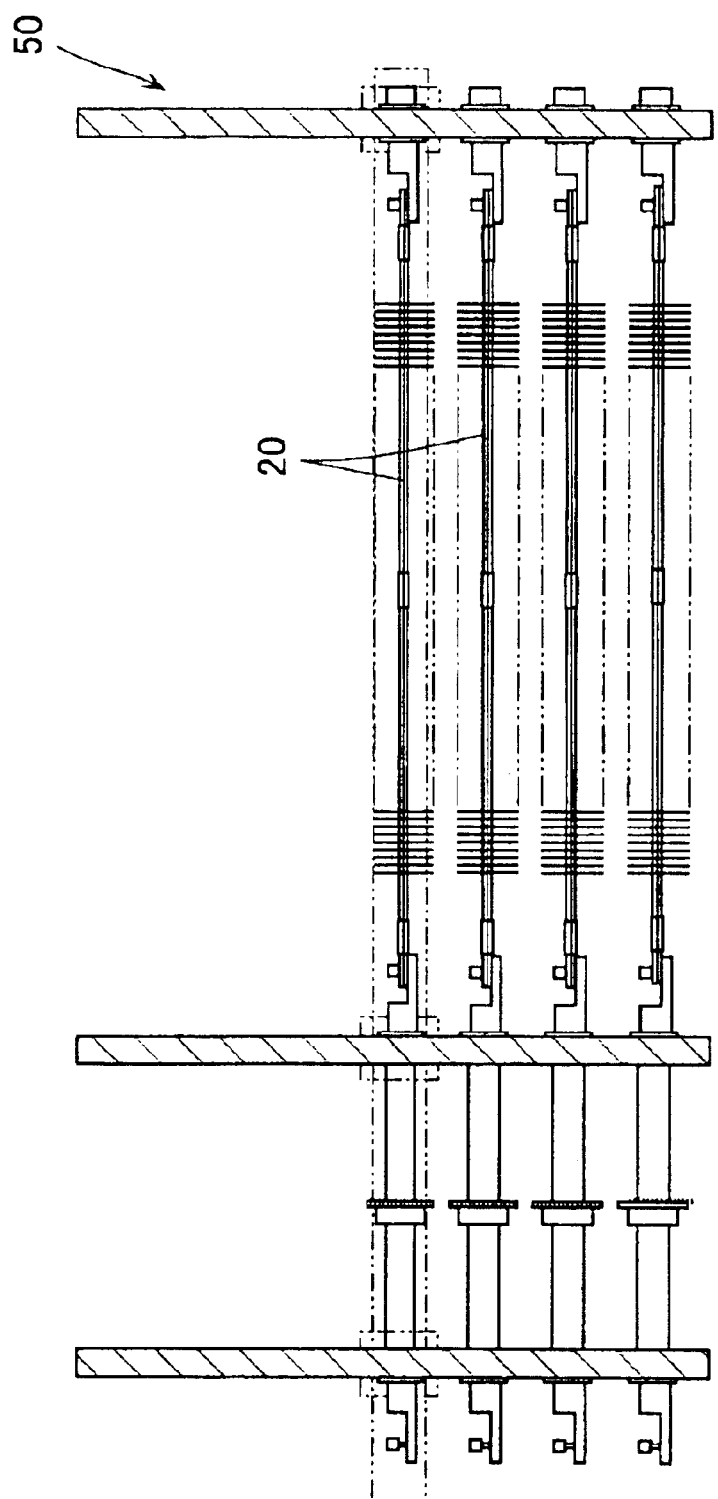
FIG. 4 is a front view showing the embodiment in a state in which it has been mounted to a rotary unit.

FIG. 4 shows the support member 20 in a state in which it has been supported on the receiving element of a rotary unit 50 which will be described hereinafter. Opposite ends of the support member 20 are placed on the receiving elements, and the support member 20 is screwed to the receiving elements by utilizing the grooves 4a.

III. Embodiment of Surface-treating Holder

Figure 5:
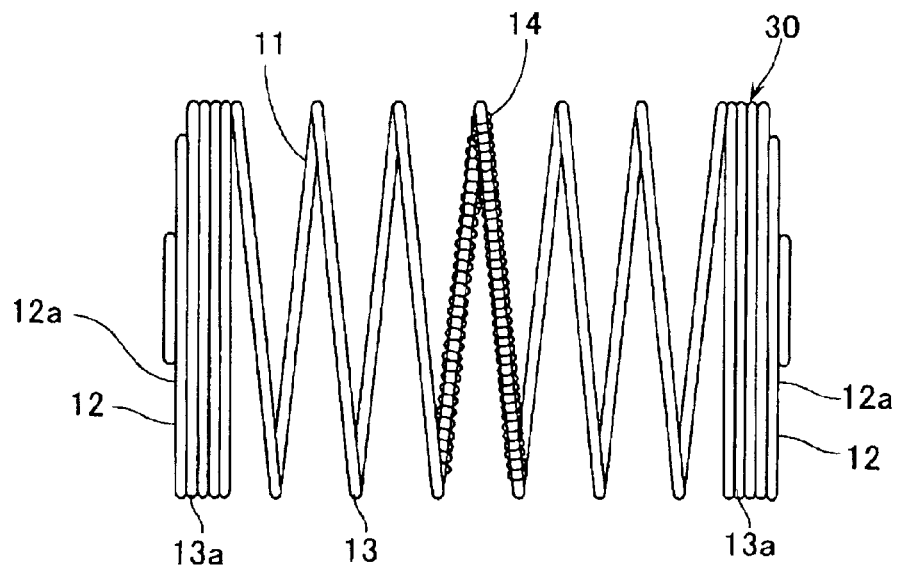
FIG. 5 is a front view of an embodiment of a surface treating holder according to the present invention.
Figure 6:
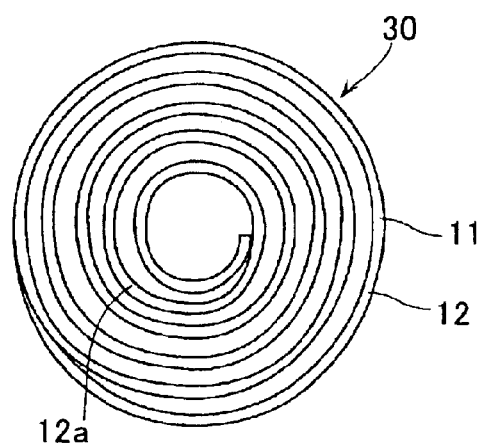
FIG. 6 is a side view of the embodiment shown in FIG. 5.

FIGS. 5 and 6 show an embodiment of a surface-treating holder according to the present invention. The surface-treating holder designated by 30 in FIGS. 5 and 6 is formed into a spring-like tubular structure, using a wire 11 made of a stainless steel (SUS304) and having a diameter of 1.6 mm by coiling the wire 11 in a counterclockwise direction with clearances being left, so that spiral-line faces 12, 12 are formed at opposite ends by coiling of the wire 11 at four turns. Between the spiral-line faces 12, 12, the wire 11 is coiled at distances of pitch of 8.2 mm. A portion 12a is formed at a center portion of the spiral-line face 12 by close coiling of the wire 12.

In this embodiment, opposite ends of the spring-like tubular portion 13 are portions 13a formed by close coiling of the wire 11 at four turns with no clearance left.

The wire 11 is coiled basically with clearances left and hence, a surface treatment such as vapor deposition of aluminum can be conducted through such clearances, and when the holders 30, 30 collide with each other, the entanglement is prevented from occurring by the closely coiled portions 12a and 13a.

In this embodiment, a spring 14 for preventing the entanglement is further wound around the wire 11 at the spring-like tubular structure 13.

Figure 7:
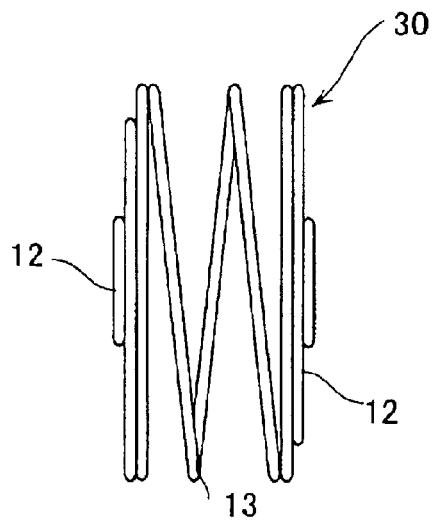
FIG. 7 is a front view of another embodiment of a surface treating holder according to the present invention.

In the above embodiment, the relatively long tubular structure is formed, but as in a modification shown in FIG. 7, a short tubular structure may be formed, and the wire may be coiled at proper turns to form a holder having any size and shape adapted to the shape of a work. This holder is designed, so that the works are accommodated in the holder and then surface-treated, while being rotated about their axis within a cage-like container

IV. Embodiment of Surface-treating Apparatus

Figure 8:
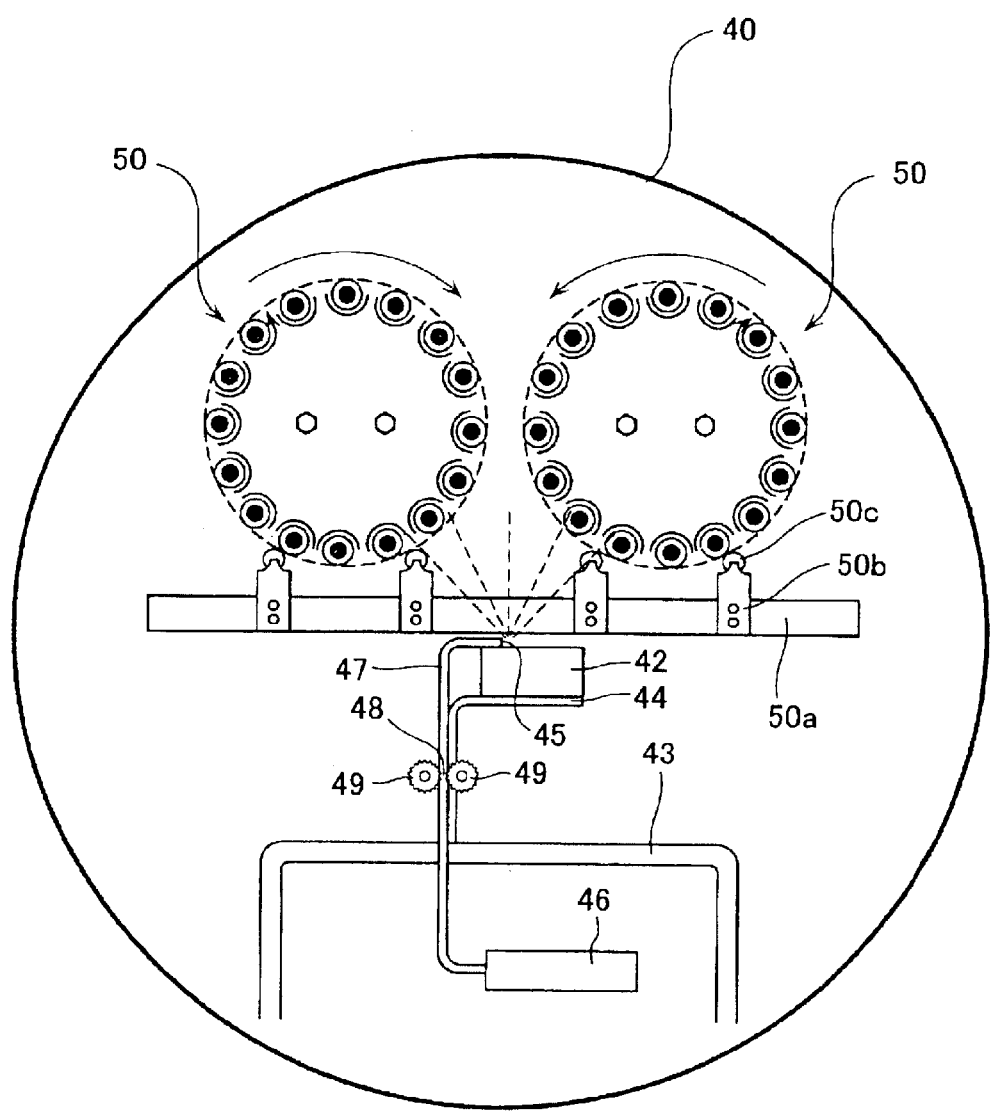
FIG. 8 is a front view of an embodiment of a surface treating apparatus according to the present invention.
Figure 9:
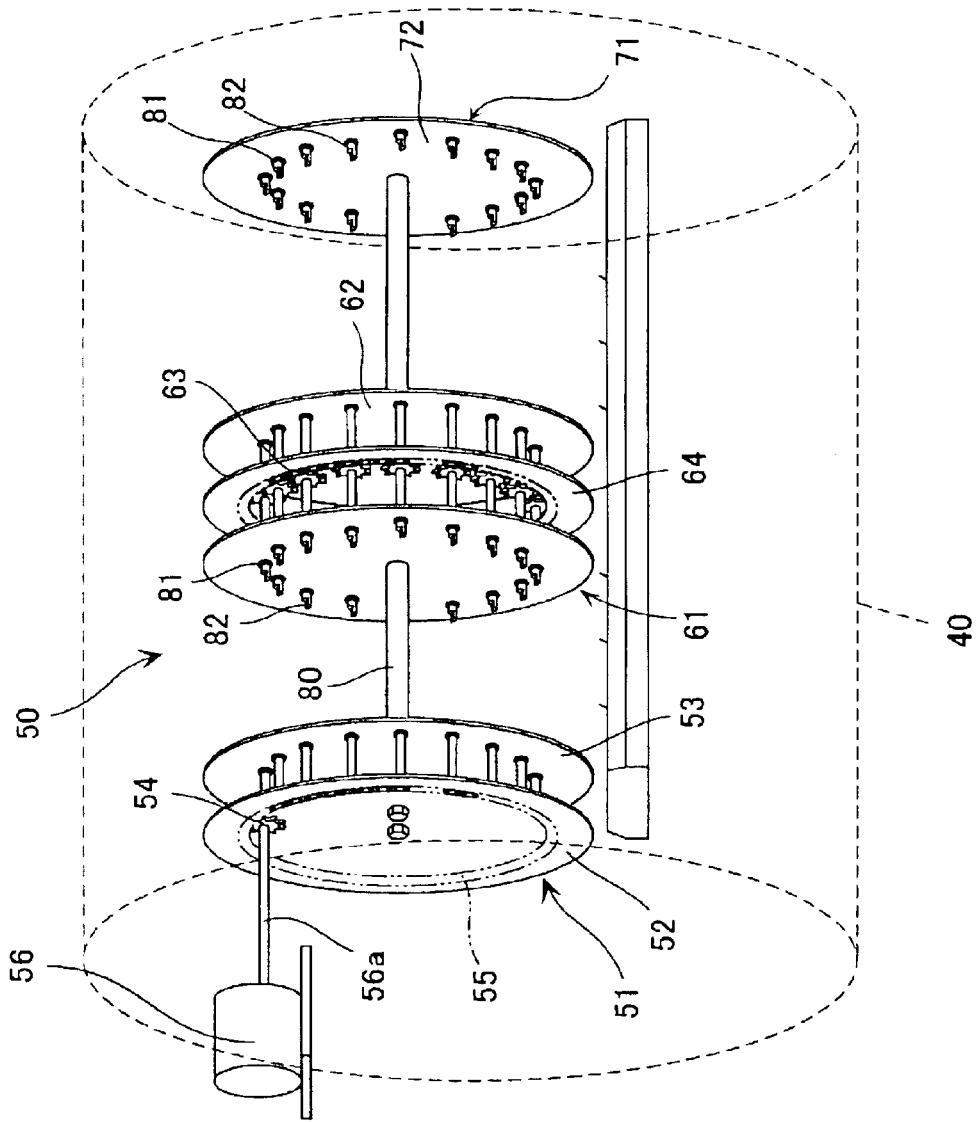
FIG. 9 is a perspective view of a rotary unit of the apparatus shown in FIG. 8.
Figure 10:
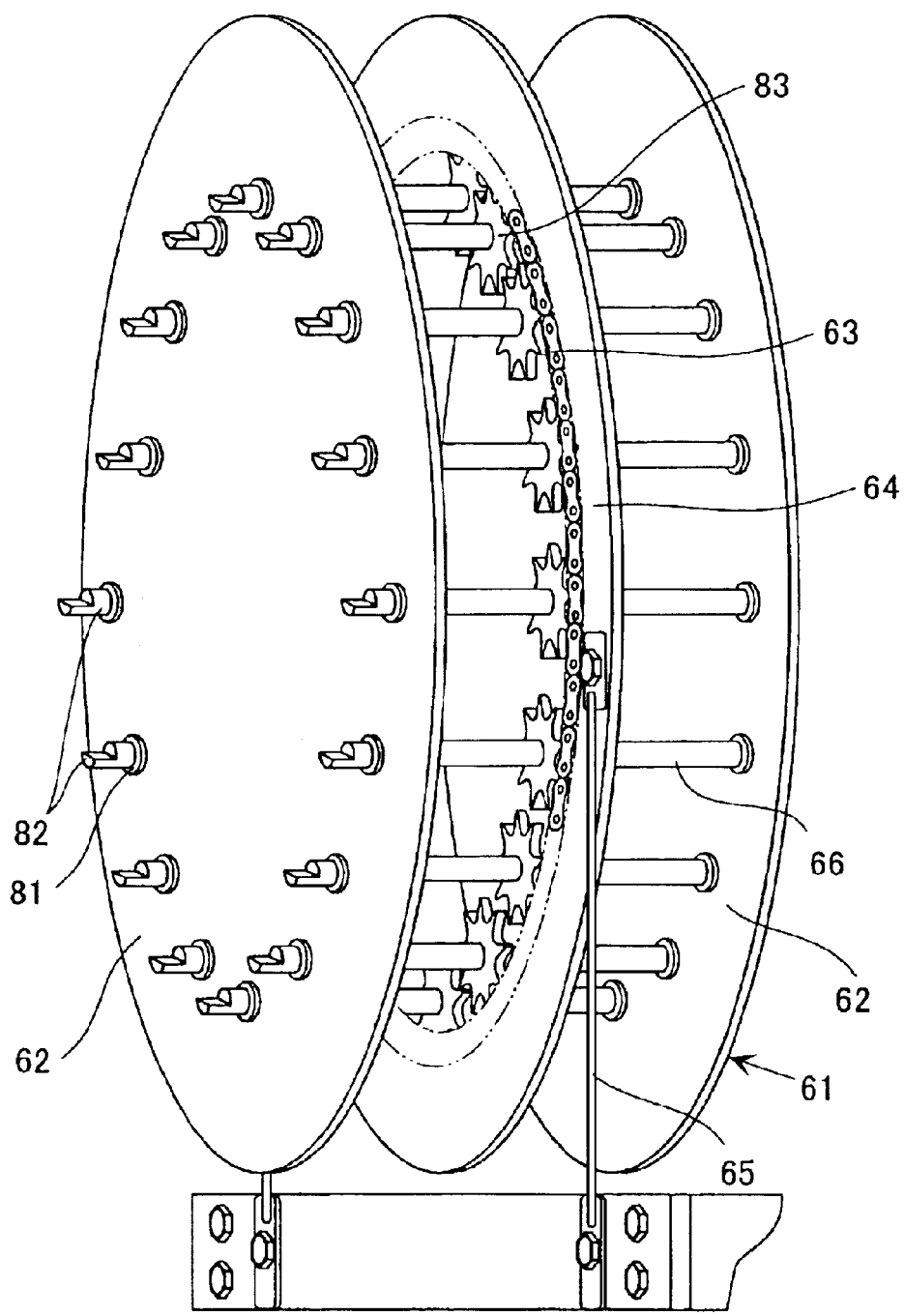
FIG. 10 is an enlarged perspective view of a disk unit for rotating works about their axes.

FIGS. 8 to 10 show an embodiment of a surface-treating apparatus. The surface-treating apparatus shown is formed as aluminum vapor-depositing apparatus.

Referring to FIG. 8, a plurality of boats for an evaporation source 42, each of which is a melting and evaporating area for vapor-depositing an aluminum material 41, are disposed on a boat support base 44 risen above a support table 43 at a lower portion of a vacuum chamber 40 connected to an evacuating system (not shown). An aluminum wire 45 which is a material to be vapor-deposited, is wound and retained around a feed reel 46 below the support table 43, so that it is delivered continuously. A leading end of the aluminum wire 45 is guided within a heat-resistant protecting tube 47 facing toward an inner surface of the boat 42. Delivering gears 49, 49 are mounted in correspondence to a notch window 48 provided in a portion of the protecting tube 47, so that the aluminum wire 45 can be supplied into the boat 42 by bringing the delivering gears 49, 49 into direct contact with the aluminum wire 45 to deliver the aluminum wire 45. The directions of the work about the rotational axis and about its axis are set, so that they are opposite from each other, as shown by arrows in FIG. 8.

Two rotary units 50, 50 are disposed within the vacuum treating chamber 40, and each constitute a means for rotating a work support member about its axis and about a rotating axis. The rotary units 50, 50 are supported by rotary unit supports 50b, 50b provided on a rest 50a, so that they can be rotated in accordance with a driving force by rollers 50c mounted on the rotary unit supports 50b.

Referring to FIG. 9, a driving disk unit 51 for rotating the work about the rotating axis, which unit constitutes each of the rotary unit 50 and which is disposed on a left side, includes two disks 52 and 53 which are disposed in an opposed relation with a narrow clearance left therebetween. A rotating sprocket chain 55 is mounted on the left ring-like disk 52 as viewed in FIG. 9 along an inner periphery of the left ring-like disk 52 and meshed with a sprocket gear 54. Thus, the rotary unit 50 is rotated about a rotational axis by transmitting the rotation of the sprocket gear 54 connected to a driving motor 56.

Referring to FIGS. 9 and 10, a driving disk unit 61 disposed centrally for rotating the work about its axis, is constructed in such a manner that a ring-like disk 64 including a sprocket chain 63 is sandwiched between two disks 62, 62. A follower disk unit 71 disposed at a right end of the rotary unit 50 is comprised of a single disk 72. The three disk units 51, 61 and 71 are connected to one another by a rotary shaft 80, so that the disk units 61 and 71 are rotated synchronously with the rotating disk unit 51 with the driving of the rotating disk unit 51.

The ring-like disk 64 including the rotating sprocket chain 63 is supported and non-rotatably fixed by a fixing arm 65, so that it is not in association with the rotation of the disks 62, 62 sandwiching the disk 64.

Receiving elements 82 rotatably through bearings 81 are mounted on each of the left and right disk units 51 and 71. Receiving elements 82 rotatable simultaneously through bearings 81 are also projectingly mounted on an outer surface of each of the left and right disks 62, 62 of the central rotating disk unit 61. A sprocket gear 83 is mounted at a central portion of each of shafts 66 interconnecting the receiving elements 82 and meshed with the rotating sprocket chain 63, so that each receiving element 82 is rotated about its axis with the rotation of the two disks 62, 62.

Thus, if the surface-treating support members are clamped between the receiving elements 82, 82 and electric current is supplied to the driving motor 56, the two disks 62, 62 of the rotating disk unit 61 and the follower disk unit 71 are rotated with the rotation of the rotating disk unit 51, whereby the surface-treating support members are rotated about the rotational axis. In addition, the sprocket gears 83 meshed with the rotating sprocket chain 63 are rotated by the rotation of two disks 62, 62 of the rotating disk unit 61 and as a result, the receiving elements 82 are rotated, and the receiving elements 82 mounted on the left and right disk units 51 and 71 are rotated freely and thus, the support members are rotated about their axes through the surface-treating support members.

Both of the rotation of the support members about the rotational axis and the rotation of the support members about their axes are performed by the driving operation of the driving motor 56 and hence, only the driving shaft 56*a* of the driving motor 56 may be inserted through the vacuum treating chamber 40. Therefore, the degree of vacuum in the vacuum treating chamber is maintained at a high level, and the evacuating time can be shortened.

In the above embodiment, the rotary unit 50 has been constructed, so that the support members can be rotated about the rotational axis and rotated about its axis. Alternatively, the rotary unit 50 may be constructed, so that the surface-treating support members are only rotated about the rotational axis, for example, by eliminating the rotating sprocket chain 68 and the sprocket gears 83.

For example, if the rotating disk unit 51, the two disks 62, 62 of the rotating disk unit 61 and the follower disk unit 71 are maintained in the fixed states, so that only the ring-like disk 64 including the sprocket gears 83 is rotated, only the receiving elements 82 are rotated, so that the surface-treating support members can be rotated only about their axes.

V. Embodiment of Surface Treatment Using Surface-treating Support Member Comprised of Upper and Lower Openable and Closable Cages The vapor deposition of aluminum was carried out using the surface-treating support member comprised of the upper and lower openable and closable cages in the above-described embodiment.

An Nd—Fe—B rare earth metal-based magnet as described in U.S. Pat. No. 4,770,723 having a size of 30 mm×10 mm×50 mm was used as a work and subjected to a vapor deposition of aluminum utilizing the above-described vapor deposition apparatus. More specifically, the support members were set in the apparatus and then, the apparatus was evacuated to $4 \times 10^{-4}$ Torr. Further, argon (Ar) gas was introduced into the apparatus, and an electric potential difference of −500 V was applied to the support members to clean the surface of the magnet for 20 minutes. Then, in a state in which an electric potential difference of −100 V was applied to the support members, the works were subjected to the vapor deposition of aluminum at a thickness of 10 μm for 25 minutes, wherein the boats were heated to evaporate aluminum. In this case, the rotation of the works about the rotational axis was at 1.2 rpm, and the rotation of the works about their axes was at 5 rpm. Under such conditions, the vapor deposition of aluminum at a thickness of 10 μm was carried out. As a result, aluminum was deposited uniformly on the work with no peeling-off of an aluminum-deposited film on a product and with no chipping of the product.

VI. Embodiment of Surface-treating Support Member Comprised of Openably/Closably Foldable Plate-Like Elements The vapor deposition of aluminum was carried out using the surface-treating support member comprised of the openably/closably foldable plate-like elements in the above-described embodiment.

A ring-like Nd—Fe—B rare earth metal-based magnet as described in U.S. Pat. No. 4,770,723 having an outside diameter of 39.5 mm, an inside diameter of 22 mm and a thickness of 0.9 mm was used as a work and subjected to a vapor deposition of aluminum at a thickness of 10 μm, utilizing the above-described vapor deposition apparatus under the same conditions, except that the vapor-depositing time was set at 15 minutes. As a result, aluminum was deposited uniformly on the work with no peeling-off of an aluminum-deposited film on a product and with no chipping of the product.

VII. Embodiment of Surface Treatment Using Surface-treating Holder

The vapor deposition of aluminum was carried out using the holder (40×60 mm) in the above-described embodiment.

Figure 11:
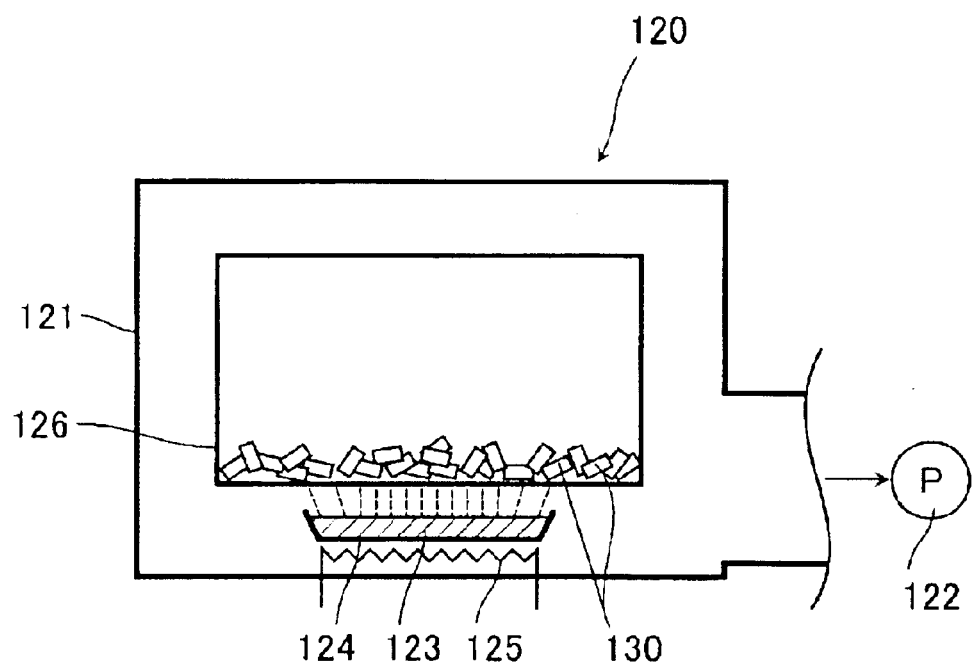
FIG. 11 is a view of a conventional surface treating apparatus.

An Nd—Fe—B rare earth metal-based magnet as described in U.S. Pat. No. 4,770,723 having a size of 30×10×50 mm was used as a work and subjected to a vapor deposition of aluminum at a thickness of 10 μm utilizing the vapor deposition apparatus shown in FIG. 11 under the same condition as in the embodiment of the surface-treating support member comprised of the upper and lower cages, except that the cage-like container was rotated at 1.2 rpm. As a result, aluminum was deposited uniformly on the work with no peeling-off of an aluminum-deposited film on a product and with no chipping of the product.

COMPARATIVE EXAMPLE

The same work was used and immediately accommodated into the cage-like container where it was subjected to the vapor deposition of aluminum without use of the holder according to the present invention as in the prior art. As a result, aluminum was deposited uniformly on the work, but scars were produced on the aluminum-deposited surface of a product; a chipping of the product was observed, resulting in a yield which was a value as low as 65%.

What is claimed is:

1. A process for surface-treating a plurality of works comprising the step of surface-treating the works in a treating chamber, while rotating the works about their axes in spaced apart states, wherein said rotation of the works is conducted with the works supported by a support member rotated about its axis, said support member comprising an upper cage and a lower cage, including a plurality of compartments, so that the cages are openable and closable in a lengthwise direction.

2. A process for surface-treating a plurality of works according to claim 1, wherein said surface treatment is a vapor deposition on a sintered article.

3. A process for surface-treating a plurality of works, comprising the step of surface-treating the works in a treating chamber, while rotating them about a rotational axis in spaced-apart states, wherein said rotation of the works is carried out with the works supported by a support member rotated about a rotational axis, the support member comprising an upper cage and a lower cage including a plurality of compartments, so that the cages are openable and closable in a lengthwise direction and so that each work can be accommodated in a compartment in a manner where each work is spaced apart from one another.

4. A process for surface-treating a plurality of works according to claim 3, wherein said surface treatment is a vapor deposition on a sintered article.

5. A process for surface-treating a plurality of works, comprising the step of surface-treating the works in a treating chamber, while rotating them about their axes and about a rotational axis in spaced-apart states, wherein said rotation of the works about the rotational axis is carried out with the works supported by a support member, the support member comprising an upper cage and a lower cage including a plurality of compartments, so that the cages are openable and closable in a lengthwise direction.

6. A process for surface-treating a plurality of works according to claim 5, wherein said surface treatment is a vapor deposition on a sintered article.

* * * * *